United States Patent
Wu et al.

(10) Patent No.: US 10,578,682 B2
(45) Date of Patent: Mar. 3, 2020

(54) ADJUSTMENT METHOD OF AN ATMOS CLOCK AND DETECTION SYSTEM PERFORMING THE SAME

(71) Applicant: I-SHOU UNIVERSITY, Kaohsiung (TW)

(72) Inventors: Rong-Ching Wu, Kaohsiung (TW); Ping-Tsang Wu, Kaohsiung (TW)

(73) Assignee: I-SHOU UNIVERSITY, Kaohsiung (TW)

( * ) Notice: Subject to any disclaimer, the term of this patent is extended or adjusted under 35 U.S.C. 154(b) by 444 days.

(21) Appl. No.: 15/463,788

(22) Filed: Mar. 20, 2017

(65) Prior Publication Data

US 2018/0188693 A1 Jul. 5, 2018

(30) Foreign Application Priority Data

Jan. 5, 2017 (TW) .............................. 106100326 A

(51) Int. Cl.
*G04D 7/00* (2006.01)
*G01R 33/02* (2006.01)
*G04G 5/00* (2013.01)

(52) U.S. Cl.
CPC .......... *G01R 33/0206* (2013.01); *G04D 7/003* (2013.01); *G04G 5/00* (2013.01)

(58) Field of Classification Search
CPC ....... G01R 33/0206; G04G 5/00; G04D 7/003
See application file for complete search history.

(56) References Cited

U.S. PATENT DOCUMENTS 10,031,481 B2 * 7/2018 Jaccard .................... G04B 1/14
2003/0206497 A1 * 11/2003 Miyazawa ................ F03G 7/06
368/204

FOREIGN PATENT DOCUMENTS

TW 201531727 A 8/2015

OTHER PUBLICATIONS

Translation of TW 201531727A from the European patent office.

* cited by examiner

*Primary Examiner* — Xin Y Zhong
(74) *Attorney, Agent, or Firm* — WPAT, PC

(57) ABSTRACT

An adjustment method of an atmos clock and a detection system performing the adjustment method are provided. The adjustment method includes detecting a magnetic field around a balance wheel of the atmos clock via a magnetic sensor, generating a measured signal, receiving the measured signal via a processing unit, and performing a clamping process on the measured signal. A clamping value is subtracted from the measured signal to generate a clamped signal. A zero value line crosses a waveform of the clamped signal to form a zero crossing point in each of the periods of swing motion of the balance wheel. The adjustment method further includes retrieving a time of the zero crossing point, calculating a time difference between the zero crossing points of two adjacent periods, calculating a length of the period according to the calculated time difference, and outputting the calculated length to an output device.

26 Claims, 5 Drawing Sheets

ADJUSTMENT METHOD OF AN ATMOS CLOCK AND DETECTION SYSTEM PERFORMING THE SAME

CROSS REFERENCE TO RELATED APPLICATIONS

The application claims the benefit of Taiwan application serial No. 106100326, filed on Jan. 5, 2017, and the subject matter of which is incorporated herein by reference.

BACKGROUND OF THE INVENTION

1. Field of the Invention

The present disclosure generally relates to an adjustment method of an atmos clock and a detection system used to perform the adjustment method and, more particularly, to an adjustment method of an atmos clock which can calculate the length of the period of the balance wheel, and a detection system used to perform the adjustment method.

2. Description of the Related Art

An atmos clock includes a movement that is constantly driven by a very slight temperature change. The atmos clock has an internal hermetically-sealed expanding capsule. In the early time, the capsule is a U-shape tube containing a mixture of mercury, ammonia and ethyl chloride. In the modern time, the capsule is filled with a mixture of several kinds of gases so that the capsule can repeatedly expand and contract under the changes in the environment temperature. This will compress the spiral spring of the atmos clock and deliver the required power to the movement. As such, the atmos clock does not need any battery, does not have to be wound up, and consumes a very little amount of energy.

Assume the mechanical loss is not considered, the movement of the atmos clock operates without any lubricant oil in order to reduce the energy consumption. If the lubricant oil is used, any little friction caused by the lubricant oil is enough to halt the atmos clock. Since the atmos clock obtains a very limited amount of energy from the temperature change, the internal components of the atmos clock have to be highly energy-economical. Since the balance wheel of the atmos clock completes only two cycles of swing in every minute, as compared with the general watch whose balance wheel completes 300 cycles of swing in every minute, the energy consumption of the atmos clock is 240 times smaller than that of the general watch.

The time precision of the atmos clock is mainly determined by the balance wheel. If the balance wheel is in a cylindrical form, the balance wheel can have a larger rotating momentum. The ideal length of period of the balance wheel is 60 seconds. If there is 0.1 seconds of error in every period, the total time error would be more than 2 minutes per day. Therefore, the atmos clock needs to be regularly adjusted to limit the time error in an acceptable range. However, the atmos clock is very quite and it is not easy to obtain its operational information. Therefore, before the user can obtain the time error of the atmos clock, the atmos clock needs to run for a certain period of time (such as 2 days). Then, the user needs to compare the indicated time of the atmos clock with the standard time to obtain the time error, and accordingly makes adjustment by themselves (unless the atmos clock is delivered back to the manufacture for the repair or adjustment works). In this regard, after the adjustment, the user still needs to wait another period of time to see if such an adjustment does eliminate the time error of the atmos clock. As a result, the time adjustment of the conventional atmos clock is time-consuming, and the user is usually not willing to make such an adjustment. Therefore, most of the atmos clocks generally have large time errors, lowering the market value of the atmos clocks.

In order to overcome the poor adjustment efficiency of the conventional atmos clock, it is necessary to provide a novel adjustment method of the atmos clock and a system performing the adjustment method.

SUMMARY OF THE INVENTION

It is therefore the objective of this disclosure to provide an adjustment method of an atmos clock and a detection system adapted to perform the adjustment method. The adjustment method and the detection system are able to calculate the period of the swing motion of the balance wheel based on the change of the magnetic field caused by the balance wheel, and the calculated result can be output to an output device for the user's viewing.

In an embodiment, an adjustment method of an atmos clock is disclosed. The adjustment method may include generating a measured signal by detecting a magnetic field around a balance wheel of the atmos clock via a magnetic sensor, receiving the measured signal via a processing unit, and performing a clamping process on the measured signal via the processing unit, in which a clamping value is subtracted from the measured signal to generate a clamped signal. A zero value line crosses a waveform of the clamped signal to form a zero crossing point in each of a plurality of periods of swing motion of the balance wheel. The adjustment method may further include retrieving a time of the zero crossing point via the processing unit, calculating a time difference between the zero crossing points of two adjacent ones of the plurality of periods via the processing unit, calculating a length of one of the plurality of periods according to the calculated time difference via the processing unit, and outputting the calculated length to an output device.

Detecting the magnetic field includes detecting a component of the magnetic field along a plane perpendicular to a shaft of the balance wheel via the magnetic sensor, so as to generate the measured signal. As the movement of the balancing screws affects the magnetic field, the effect is most noticeable along the plane. Based on this, the magnetic sensor measures the magnetic field along the plane in order to obtain a signal having a larger variation for subsequent analysis.

The magnetic field is zero on the zero value line such that the zero value line can cross the waveform of the clamped signal to form the zero crossing point in each of the plurality of periods of swing motion of the balance wheel.

The waveform of the clamped signal goes up or down to cross the zero value line at the zero crossing point. As such, the processing unit needs to consider only the zero crossing point where the waveform of the clamped signal goes down to cross the zero value line, or to consider only the zero crossing point where the waveform of the clamped signal goes up to cross the zero value line. Thus, the calculation process of the processing unit is simplified.

The zero value line crosses the waveform of the clamped signal to form another zero crossing point in each of the plurality of periods of swing motion of the balance wheel. The processing unit retrieves the time of one of the zero crossing points to simplify the calculation process of the processing unit.

The adjustment method further includes sampling the measured signal with a plurality of sampling points via the magnetic sensor or the processing unit. As such, the measured signal can be digitalized for further analysis.

The clamping process is expressed as:

$$x_n = x_n' - x_{clamp}, n=1, \ldots, N,$$

$$x_{clamp} = \eta x_{max}' + (1-\eta) x_{min}'.$$

$x_n'$ is a magnitude of the magnetic field of the measured signal at each of the plurality of sampling points, N is a number of the plurality of sampling points, $x_{clamp}$ is a clamping value, $x_n'$ is a magnitude of a magnetic field of the clamped signal at each of the plurality of sampling points, $\eta$ is a clamping index which is between 0 and 1, $x_{max}'$ is a maximal magnitude of the magnetic field of the measured signal, and $x_{min}'$ is a minimal magnitude of the magnetic field of the measured signal. As such, the clamped signal that crosses the zero value line can be generated to calculate the length of period of the swing motion of the balance wheel.

Retrieving the time of the zero crossing point includes performing an interpolation process on two sampling points of the plurality of sampling points via the processing unit. The two sampling points are most adjacent to the zero crossing point among the plurality of sampling points. The clamping process is expressed as:

$$t^* = t_a + \frac{-x_a}{x_{a+1} - x_a}(t_{a+1} - t_a).$$

$t_a$ is a time of a first one of the two sampling points, $t_{a+1}$ is a time of a second one of the two sampling points, $x_a$ is the magnitude of the magnetic field of the clamped signal at the first one of the two sampling points, and $x_{a+1}$ is the magnitude of the magnetic field of the clamped signal at the second one of the two sampling points. As such, although the zero crossing point is not the sampling point; the processing unit is still able to calculate the time of the zero crossing point.

The length of one of the plurality of periods is expressed as:

$$T_m = t^*_{m+1} - t^*_m.$$

$t^*_m$ is the time of the zero crossing point in one of the two adjacent ones of the plurality of periods, and $t^*_{m+1}$ is the time of the zero crossing point in another of the two adjacent ones of the plurality of periods. As such, the processing unit is able to calculate the length of period of the swing motion of the balance wheel.

The measured signal is sampled in a sampling rate of 12.5-14.3 (1/s). As such, the sampling rate permits the processing unit to achieve an accurate calculation and avoids increasing the calculation burden of the processing unit.

The adjustment method of the atmos clock further includes calculating an average length of multiple periods of the plurality of periods via the processing unit and outputting the calculated average length to the output device. By the calculation of the average length of the multiple periods, the calculated result of the processing unit is less affected by these time-dependent factors.

A number of the multiple periods is larger than or equal to 10. As such, the processing unit calculates the average length of more than 10 periods of the balance wheel, thereby achieving the high accuracy of the calculated result (less affected by the time-dependent factors).

In another embodiment, a detection system adapted to perform an adjustment method of an atmos clock includes a magnetic sensor, a processing unit coupled with the magnetic sensor, and an output device coupled with the processing unit.

The magnetic sensor is a 3-axis magnetic sensor capable of measuring the components of the magnetic field in individual axes of the coordinate system.

The magnetic sensor is arranged in a position facing a balance wheel of the atmos clock. The balance wheel includes a shaft, and one of three axes of the magnetic sensor is parallel to the shaft. As such, the magnetic field on the plane can be detected by the magnetic sensor.

In the adjustment method of the atmos clock and the detection system adapted to perform the adjustment method, the magnetic sensor is used to detect the change of the magnetic field under the arrangement of the balance wheel. Then, the processing unit is used to quickly calculate the length of the period or the average length of multiple periods, and the calculated result is output to an output device for the user to adjust the atmos clock. Thus, the adjustment time of the atmos clock is significantly reduced and the adjustment efficiency is improved.

BRIEF DESCRIPTION OF THE DRAWINGS

The present disclosure will become more fully understood from the detailed description given hereinafter and the accompanying drawings which are given by way of illustration only, and thus are not limitative of the present disclosure, and wherein.

Figure 1:
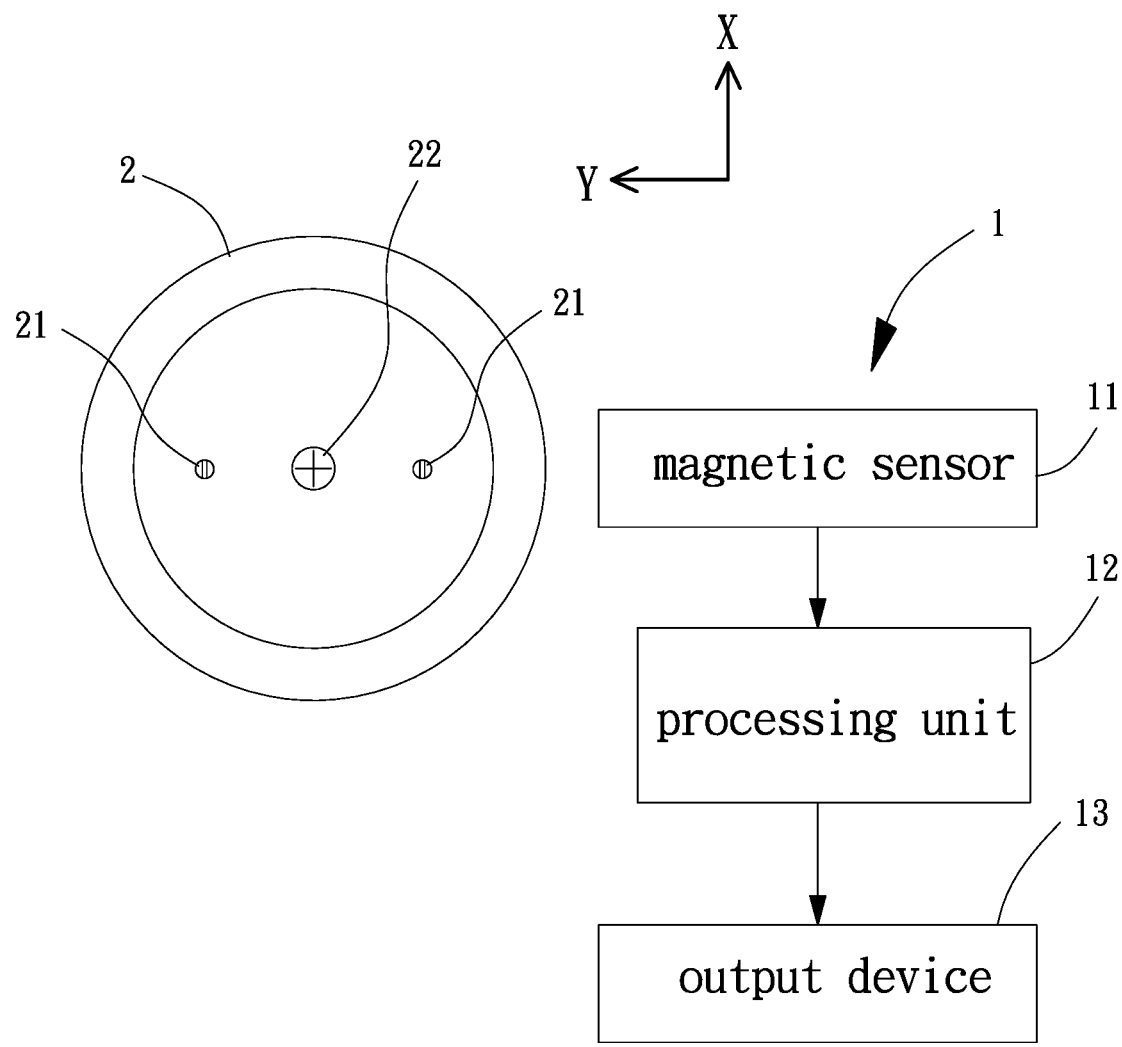
FIG. 1 shows a detection system adapted to perform an adjustment method of an atmos clock according to an embodiment of the disclosure.

In the various figures of the drawings, the same numerals designate the same or similar parts. Furthermore, when the terms "first", "second", "third", "fourth", "inner", "outer", "top", "bottom", "front", "rear" and similar terms are used hereinafter, it should be understood that these terms have reference only to the structure shown in the drawings as it would appear to a person viewing the drawings, and are utilized only to facilitate describing the disclosure.

DETAILED DESCRIPTION OF THE INVENTION

FIG. 1 shows a detection system 1 adapted to perform an adjustment method of an atmos clock according to an embodiment of the disclosure. The detection system 1 includes a magnetic sensor 11, a processing unit 12 and an output device 13. The processing unit 12 is coupled with the magnetic sensor 11, and the output device 13 is coupled with the processing unit 12.

The magnetic sensor 11 can be used to detect a magnetic field. The magnetic sensor 11 can be a 3-axis magnetic sensor such as a 3-axis electronic compass, so as to detect the magnitudes of the magnetic field in individual axes of the coordinate system. The processing unit 12 may be a calculation device such as a computer or a microcontroller unit. The output device 13 may be a display (such as a liquid display), a needle or other types of output devices.

FIG. 1 also shows a balance wheel 2 of the atmos clock. The balance wheel 2 includes two balancing screws 21 that can fine adjust the rotating inertia of the balance wheel 2. The balancing screws 21 are paramagnetic so that the movement of the balancing screws 21 will affect the magnetic field.

Figure 2:
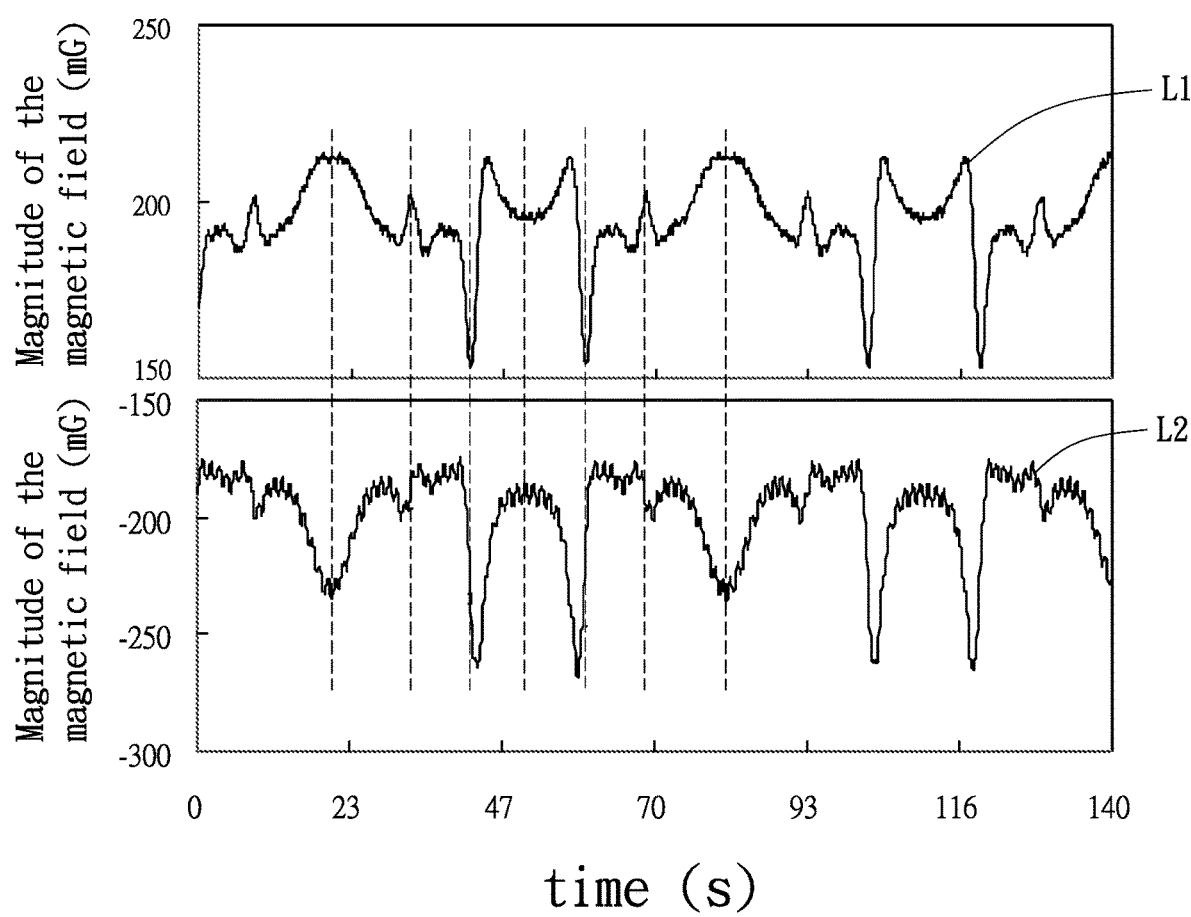
FIG. 2 shows a measured magnetic field detected by a magnetic sensor of the detection system.

In the adjustment method of the atmos clock according to the embodiment of the disclosure, the magnetic sensor 11 is arranged in a position facing the balance wheel 2 in order to detect the magnetic field around the balance wheel 2. FIG. 2 shows a measured magnetic field of the balance wheel 2 as detected by the magnetic sensor 11. The balance wheel 2 receives the measured results.

The balance wheel 2 includes a shaft 22 that can be hanged in a predetermined location by an alloy filament (elinvar). Thus, the balance wheel 2 can rotate about the shaft 22. As the rotation of the balance wheel 2 causes movement of the balancing screws 21, the movement of the balancing screws 21 will affect the magnetic field. The effect is most noticeable along the X-Y plane defined by a first axis X and a second axis Y perpendicular to the first axis X. Based on this, the magnetic sensor 11 preferably measures the magnetic field along the X-Y plane in order to obtain a signal having a larger variation for subsequent analysis. As stated above, the magnetic sensor 11 is preferably a 3-axis magnetic sensor. Thus, as long as one of the axes of the magnetic sensor 11 is aligned with the shaft 22, the magnetic sensor 11 is able to detect the magnetic field along the X-Y plane. Furthermore, for any two directions that are perpendicular to each other on the X-Y plane (such as the first axis X and the second axis Y, for example), the magnetic sensor 11 is able to detect the component of the magnetic field in each of the two directions. Accordingly, the magnetic sensor 11 can obtain two measured signals L1 and L2 as shown in FIG. 2. In other words, the measured results generated by the magnetic sensor 11 include the signals L1 and L2.

In the embodiment, the signal L1 depicts the relationship between the detected magnetic field and time in the first axis X, and the signal L2 depicts the relationship between the detected magnetic field and time in the second axis Y. However, it appears in FIG. 2 that the two signals L1 and L2 have reverse signal patterns. Therefore, after the processing unit 12 receives the measured results of the magnetic sensor 11, the magnetic sensor 11 can analyze only one of the signals, such as the signal L1 of the first axis X. Alternatively, the processing unit 12 can also receive only one of the signals, such as the signal L1 of the first axis X.

Figure 3:
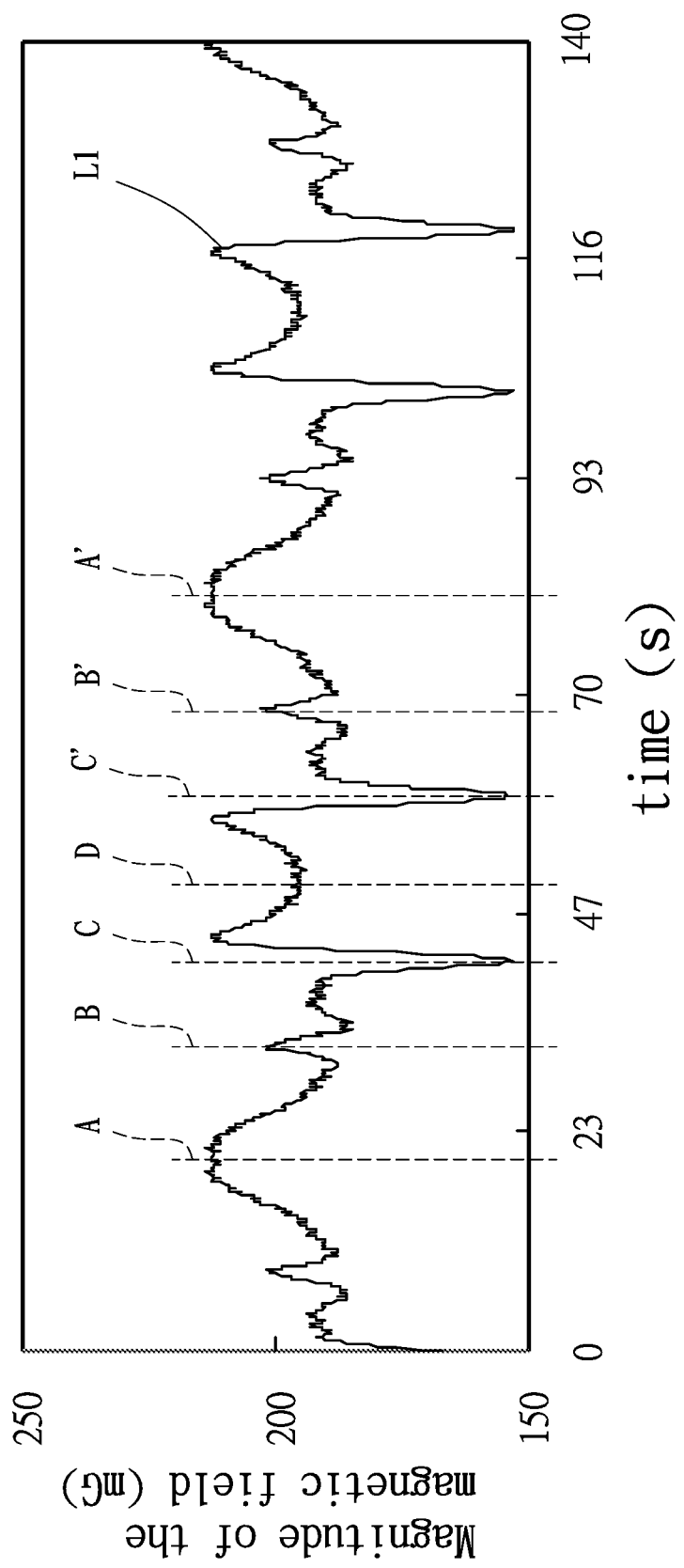
FIG. 3 shows a magnified pattern of the measured magnetic field retrieved in a first axis according to the embodiment of the disclosure.

FIG. 3 shows a magnified pattern of the signal L1. The points A, D and A' represent the turning points of the balance wheel 2. For example, if the balance wheel 2 rotates in a first direction from time points A to D (such as in a clockwise direction), the balance wheel 2 will rotate in a second direction from time points D to A' (such as in a counterclockwise direction). Since the balance wheel 2 has the lowest speed at the turning points, the magnetic field will have smaller variations around the turning points. Thus, it can be known that the balance wheel 2 completes one cycle of swing from time points A to A'.

It is noted that there are two spike waves between time points A and D. The two spike waves appear at time points B and C, respectively. There are also another two spike waves, which are symmetric to the previous two spike waves, between the time points D and A'. The spike waves at the time points B and B' are generated due to the passage of one of the balancing screws 21, and the spike waves at the time points C and C' are generated due to the passage of another of the balancing screws 21. For explanation purpose, the spike wave at the time point C is used to analyze the period in the embodiment, and it is understood that the spike wave at time point B can also be used. The disclosure is not limited to either option.

The detection system 1 or the balance wheel 2 can perform signal sampling on the signal L1. As such, the signal L1 will contain a plurality of sampling points, each having a relationship between the magnetic field and time. Based on this, the signal L1 can be digitalized for further analysis. The sampling rate can be determined as desired. In general, the higher the sampling rate the more accurate the analyzed results. However, if the sampling rate is too high, the burden of the processing unit 12 will be too large. Also, the magnetic sensor 11 has a limited sensitivity such that the magnetic sensor 11 has a limited reaction speed. For example, the magnetic sensor 11 (the 3-axis magnetic sensor) has a fastest reaction time of 70-80 ms. Due to the limited reaction speed, the sampling rate can be set as 12.5-14.3 (l/s), and is preferably set as 12.96 (l/s) which is 1/77 ms.

Next, the adjustment method performs a clamping process via the processing unit 12. In the clamping process, a clamping value is subtracted from the signal L1 of the first axis X, so as to generate a clamped signal L3. The clamping process is expressed as the equation (1) below:

$$x_n = x_n' - x_{clamp}, n=1, \ldots, N$$

$$x_{clamp} = \eta x_{max}' + (1-\eta)x_{min}' \quad (1).$$

$x_n'$ represents the magnitude of the magnetic field of the signal L1 at each of the sampling points. N is the number of times of sampling. $x_{clamp}$ is the clamping value. $x_n$ represents the magnitude of the magnetic field of the clamped signal L3 at each of the sampling points. $\eta$ represents the clamping index which is between 0 and 1. $x_{max}'$ represents the maximal magnitude of the magnetic field of the signal L1, and $x_{min}'$ represents the minimal magnitude of the magnetic field of the signal L1.

Figure 4:
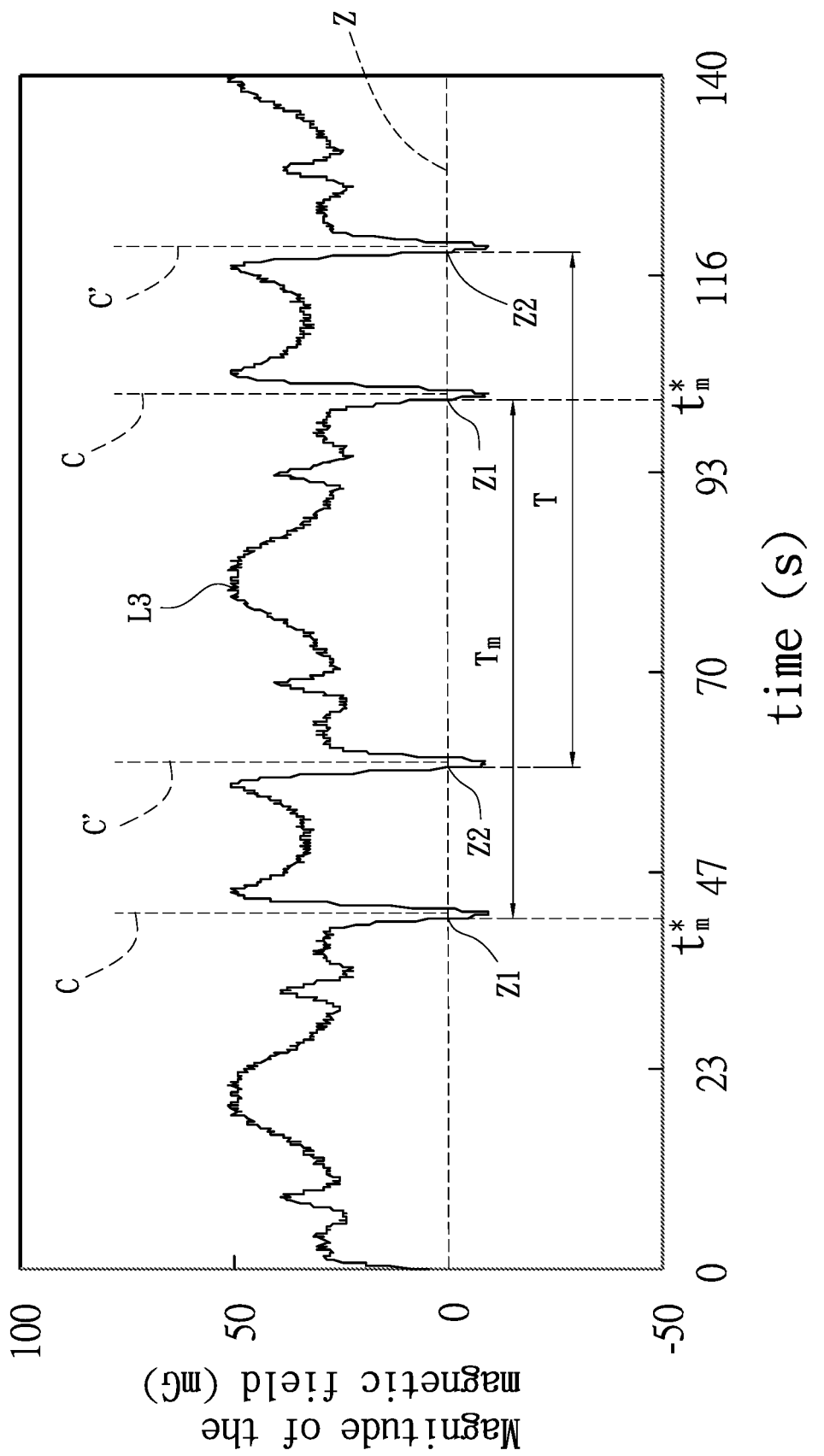
FIG. 4 shows a clamped signal obtained from a clamping process.

FIG. 4 shows the clamped signal L3 obtained from the clamping process. In FIG. 4, a zero value line Z crosses the waveform of the clamped signal L3 to form at least one zero crossing point in each period of the balance wheel 2. The zero value line Z is a reference line where the magnitude of the magnetic field is zero. The processing unit 12 retrieves the time(s) of the zero crossing point(s). The zero crossing point may be a point where the waveform of the clamped signal L3 goes down to cross the zero value line Z. However, in another embodiment, the zero crossing point may be a point where the waveform of the clamped signal L3 goes up to cross the zero value line Z. Based on this, the processing unit 12 can omit the points where the waveform of the clamped signal L3 goes up to cross the zero value line Z while considering only the points where the waveform of the clamped signal L3 goes down to cross the zero value line Z, and vice versa (i.e. omitting the points where the waveform of the clamped signal L3 goes down to cross the zero value line Z while considering only the points where the waveform of the clamped signal L3 goes up to cross the zero value line Z). Thus, the calculation process of the processing unit 12 can be reduced.

There may be one or more zero crossing points. For example, if the clamping index $\eta$ is set as 0.2, the zero value line Z may pass the spike waves of time points C and C'.

Therefore, when the waveform of the spike wave of the magnetic field goes down to cross the zero value line Z at time point C, a first zero crossing point Z1 is formed. Likewise, when the waveform of the spike wave of the magnetic field goes down to cross the zero value line Z at time point C', a second zero crossing point Z2 is formed. The processing unit 12 will retrieve the time of one of the zero crossing points Z1 and Z2 (such as the first zero crossing point Z1) in order to simplify the calculation process of the processing unit 12.

Specifically, the clamped signal L3 is obtained by performing the clamping process on the signal L1 of the first axis X. As stated, since the signal sampling was performed on the signal L1, the first zero crossing point Z1 may not be the sampling point. Therefore, the processing unit 12 performs an interpolation process on the two sampling points that are most adjacent to the first zero crossing point Z1, so as to calculate the time t* of the first zero crossing point Z1. The interpolation process may be expressed in the equation (2) below:

$$t^* = t_a + \frac{-x_a}{x_{a+1} - x_a}(t_{a+1} - t_a). \tag{2}$$

In the equation (2), $t_a$ represents the time of one of the two sampling points, and $t_{a+1}$ represents the time of another of the two sampling points. In addition, $x_a$ represents the magnitude of the magnetic field at one of the two sampling points, and $x_{a+1}$ represents the magnitude of the magnetic field at the other of the two sampling points.

The balance wheel 2 can complete one cycle of back-and-forth swing in a period T. Therefore, the first zero crossing point Z1 will appear in each period T of the swing motion of the balance wheel 2. In this regard, for any two adjacent periods of the swing motion of the balance wheel 2, the processing unit 12 can obtain the length of the period T of the swing motion by calculating the time difference between the first zero crossing points Z1 of the two adjacent periods. The length of the period T may be expressed as the equation (3) below:

$$T_m = t^*_{m+1} - t^*_m \tag{3}.$$

$t^*_m$ represents the time of the first zero crossing point Z1 in one of the two adjacent periods, and $t^*_{m+1}$ represents the time of the first zero crossing point Z1 in another of the two adjacent periods.

The processing unit 12 outputs the calculated result to the output device 13 for the user's viewing. Based on this, the adjustment method of the atmos clock according to the embodiment of the disclosure can calculate the length of the period T and output the calculated result to the output device 13. As such, the user is able to obtain the difference between the actual length of the period T (as calculated) and the ideal length of the period T (60 seconds), and accordingly adjusts the balance wheel 2 through the regulator pin outside of the atmos clock. Besides, the user is also able to repeatedly perform the adjustment method during the adjustment process of the atmos clock to ensure whether the error in the length of the period T is eliminated.

In the above embodiment, although the length of the period T of the swing motion of the balance wheel 2 is calculated from the time difference between two adjacent first zero crossing points Z1, the processing unit 12 can also perform the interpolation process of the equation (2) and the length calculation of the equation (3) based on two adjacent second zero crossing points Z2. The disclosure is not limited to either option.

It is noted that since the atmos clock is a sophisticated mechanical structure, the length of the period of the balance wheel 2 tends to have an error due to a variety of time-dependent factors such as humidity, air pressure or noise. This causes an error in a single period T. To solve this problem, the processing unit 12 preferably calculates an average length $T_{AVG}$ of multiple periods T to reduce the degree the calculated result of the balance wheel 2 is affected by these time-dependent factors. The calculation of the average length $T_{AVG}$ can be expressed in the equation (4) below:

$$T_{AVG} = \frac{\sum_{m=1}^{M} T_m}{M}. \tag{4}$$

Figure 5:
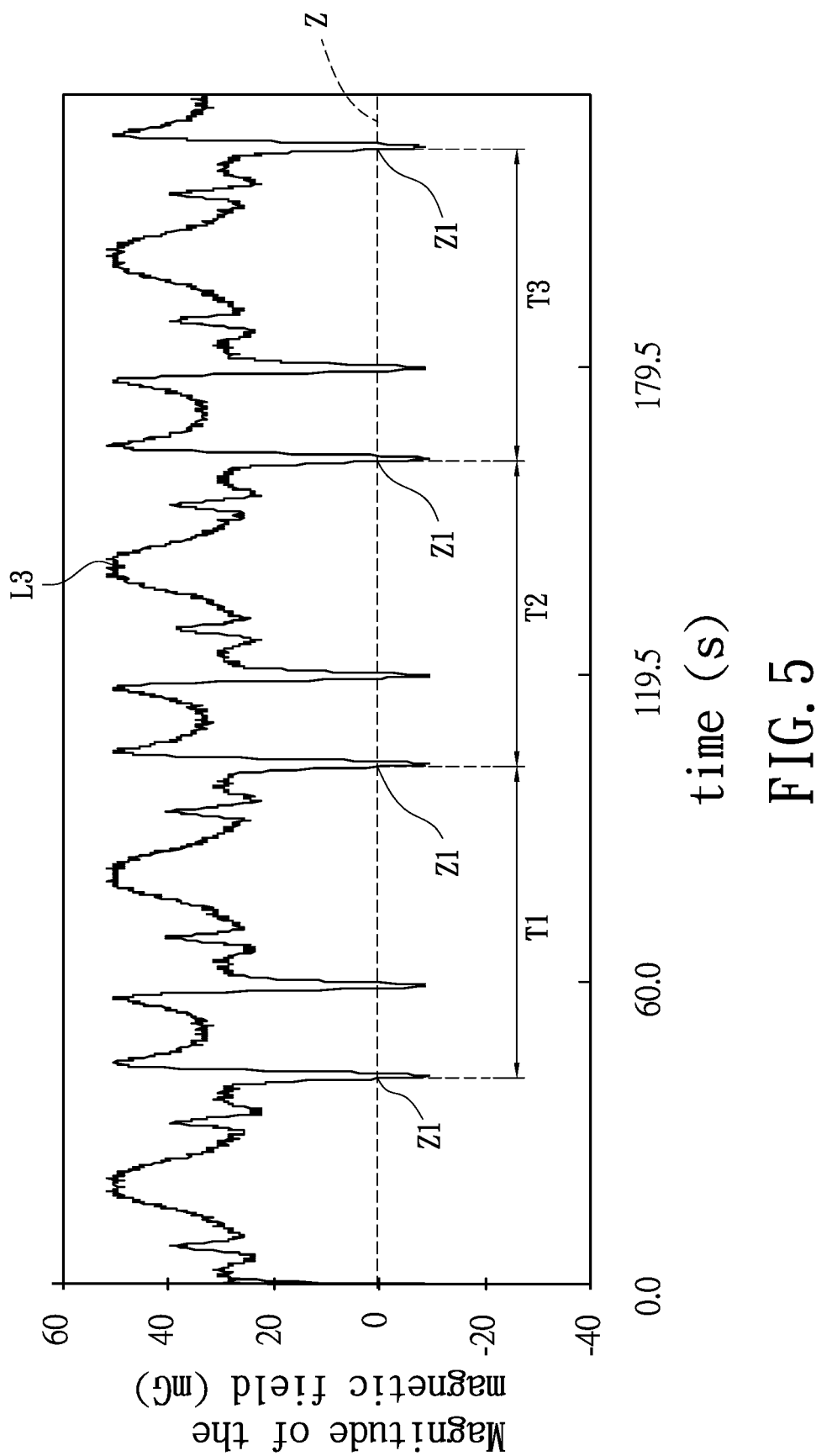
FIG. 5 shows the clamped signal after the adjustment method of the disclosure had been performed for more than 3 minutes.

In the equation (4), M represents the number of the periods that are sampled by the balance wheel 2. The number of the sampled periods can be a predetermined value or can be set by the user. For example, FIG. 5 shows the clamped signal L3 generated by the processing unit 12 after the adjustment method of the disclosure had been performed for more than 3 minutes. The processing unit 12 may obtain the lengths of three periods $T_1$, $T_2$ and $T_3$ of the balance wheel 2 by several times of calculation of the equation (3). In this regard, if M is set as 3, the processing unit 12 calculates the average length $T_{AVG}$ of the three periods $T_1$, $T_2$ and $T_3$ based on the equation (4), and outputs the calculated result to the output device 13. However, in the embodiment, the value of M is preferably larger than 10. In other words, the adjustment method of the disclosure is preferably executed for more than 10 minutes and the processing unit 12 preferably calculates the average length $T_{AVG}$ of more than 10 periods T, so as to achieve the high accuracy of the calculated result (less affected by the time-dependent factors).

Moreover, in the embodiment, although the clamping index η is set as 0.2 where the zero value line Z passes through the spike waves at time points C1 and C2, the clamping index η may be set as a different value to adjust the position of the zero value line Z. In this regard, as long as the clamped signal L3 crosses the zero value line Z to form at least one zero crossing point in each period of the swing motion of the balance wheel 2, the balance wheel 2 is able to calculate the length of the period or the average length $T_{AVG}$ of multiple periods T based on the above calculation processes.

Based on the above, the adjustment method of the atmos clock detects the change of the magnetic field under the arrangement of the balance wheel 2 through a magnetic sensor 11 of a detection system 1, and is able to quickly calculate the length of the period or the average length $T_{AVG}$ of multiple periods T through the processing unit 12. The adjustment method of the atmos clock can further send the calculated result to an output device 13 such that the user can accordingly adjust the time of the atmos clock. As compared with the conventional atmos clock where it takes a certain period of time (such as 2 days) to run the atmos clock before the user can obtain the accumulated time error of the clock by comparing the indicated time of the clock with the standard time, the adjustment method and the detection system 1 performing the same according to the embodiment of the disclosure can significantly reduce the adjustment time of the atmos clock. As such, the adjustment efficiency of the atmos clock is improved, and the user will be more willing to adjust the time of the atmos clock. Advantageously, the market value of the atmos clock can be increased.

Although the disclosure has been described in detail with reference to its presently preferable embodiments, it will be understood by one of ordinary skill in the art that various modifications can be made without departing from the spirit and the scope of the disclosure, as set forth in the appended claims.

What is claimed is:

1. An adjustment method of an atmos clock, comprising:
   generating a measured signal by detecting a magnetic field around a balance wheel of the atmos clock via a magnetic sensor;
   receiving the measured signal via a processing unit;
   performing a clamping process on the measured signal via the processing unit, in which a clamping value is subtracted from the measured signal to generate a clamped signal, wherein a zero value line crosses a waveform of the clamped signal to form a zero crossing point in each of a plurality of periods of swing motion of the balance wheel;
   retrieving a time of the zero crossing point via the processing unit;
   calculating a time difference between the zero crossing points of two adjacent ones of the plurality of periods via the processing unit;
   calculating a length of one of the plurality of periods according to the calculated time difference via the processing unit;
   outputting the calculated length to an output device; and
   adjusting the balance wheel of the atmos clock according to the calculated length.

2. The adjustment method of the atmos clock as claimed in claim 1, wherein detecting the magnetic field comprises detecting a component of the magnetic field along a plane perpendicular to a shaft of the balance wheel via the magnetic sensor, so as to generate the measured signal.

3. The adjustment method of the atmos clock as claimed in claim 1, wherein the magnetic field is zero on the zero value line.

4. The adjustment method of the atmos clock as claimed in claim 1, wherein the waveform of the clamped signal goes up or down to cross the zero value line at the zero crossing point.

5. The adjustment method of the atmos clock as claimed in claim 1, wherein the zero value line crosses the waveform of the clamped signal to form another zero crossing point in each of the plurality of periods of swing motion of the balance wheel.

6. The adjustment method of the atmos clock as claimed in claim 1, further comprising sampling the measured signal with a plurality of sampling points via the magnetic sensor or the processing unit.

7. The adjustment method of the atmos clock as claimed in claim 6, wherein the clamping process is expressed as:

$$x_n = x_n' - x_{clamp}, n=1, \ldots, N,$$

$$x_{clamp} = \eta x_{max}' + (1-\eta) x_{min}',$$

wherein $x_n'$ is a magnitude of the magnetic field of the measured signal at each of the plurality of sampling points, wherein N is a number of the plurality of sampling points, wherein $x_{clamp}$ is a clamping value, wherein $x_n$ is a magnitude of a magnetic field of the clamped signal at each of the plurality of sampling points, wherein $\eta$ is a clamping index which is between 0 and 1, wherein $x_{max}'$ is a maximal magnitude of the magnetic field of the measured signal, and wherein $x_{min}'$ is a minimal magnitude of the magnetic field of the measured signal.

8. The adjustment method of the atmos clock as claimed in claim 7, wherein retrieving the time of the zero crossing point comprises performing an interpolation process on two sampling points of the plurality of sampling points via the processing unit, wherein the two sampling points are most adjacent to the zero crossing point among the plurality of sampling points, wherein the clamping process is expressed as:

$$t^* = t_a + \frac{-x_a}{x_{a+1} - x_a}(t_{a+1} - t_a),$$

wherein $t_a$ is a time of a first one of the two sampling points, wherein $t_{a+1}$ is a time of a second one of the two sampling points, wherein $x_a$ is the magnitude of the magnetic field of the clamped signal at the first one of the two sampling points, and wherein $x_{a+1}$ is the magnitude of the magnetic field of the clamped signal at the second one of the two sampling points.

9. The adjustment method of the atmos clock as claimed in claim 8, wherein the length of one of the plurality of periods is expressed as:

$$T_m = t^*_{m+1} - t^*_m$$

wherein $t^*_m$ is the time of the zero crossing point in one of the two adjacent ones of the plurality of periods, and wherein $t^*_{m+1}$ is the time of the zero crossing point in another of the two adjacent ones of the plurality of periods.

10. The adjustment method of the atmos clock as claimed in claim 6, wherein the measured signal is sampled in a sampling rate of 12.5-14.3 (1/s).

11. The adjustment method of the atmos clock as claimed in claim 1, further comprising:
    calculating an average length of multiple periods of the plurality of periods via the processing unit; and
    outputting the calculated average length to the output device.

12. The adjustment method of the atmos clock as claimed in claim 11, wherein a number of the multiple periods is larger than or equal to 10.

13. A detection system adapted to perform an adjustment method of an atmos clock, comprising:
    a magnetic sensor detecting a magnetic field around a balance wheel of the atmos clock and generating a measured signal according to the detected result;
    a processing unit coupled with the magnetic sensor, wherein the processing unit receives the measured signal and performs a clamping process on the measured signal, wherein the processing unit further subtracts a clamping value from the measured signal to generate a clamped signal, wherein a zero value line crosses a waveform of the clamped signal to form a zero crossing point in each of a plurality of periods of swing motion of the balance wheel, wherein the processing unit further retrieves a time of the zero crossing point, calculates a time difference between the zero crossing points of two adjacent ones of the plurality of periods, and calculates a length of one of the plurality of periods according to the calculated time difference; and an output device coupled with the processing unit and receiving information regarding the calculated length.

14. The detection system adapted to perform the adjustment method of the atmos clock as claimed in claim 13, wherein the magnetic sensor is a 3-axis magnetic sensor.

15. The detection system adapted to perform the adjustment method of the atmos clock as claimed in claim 14, wherein the magnetic sensor is arranged in a position facing a balance wheel of the atmos clock, wherein the balance wheel comprises a shaft, and wherein one of three axes of the magnetic sensor is parallel to the shaft.

16. The detection system adapted to perform the adjustment method of the atmos clock as claimed in claim 13, wherein the magnetic sensor detects a component of the magnetic field along a plane perpendicular to a shaft of the balance wheel, so as to generate the measured signal.

17. The detection system adapted to perform the adjustment method of the atmos clock as claimed in claim 13, wherein the magnetic field is zero on the zero value line.

18. The detection system adapted to perform the adjustment method of the atmos clock as claimed in claim 13, wherein the waveform of the clamped signal goes up or down to cross the zero value line at the zero crossing point.

19. The detection system adapted to perform the adjustment method of the atmos clock as claimed in claim 13, wherein the zero value line crosses the waveform of the clamped signal to form another zero crossing point in each of the plurality of periods of swing motion of the balance wheel.

20. The detection system adapted to perform the adjustment method of the atmos clock as claimed in claim 13, wherein the magnetic sensor or the processing unit further samples the measured signal with a plurality of sampling points.

21. The detection system adapted to perform the adjustment method of the atmos clock as claimed in claim 20, wherein the clamping process is expressed as:

$$x_n = x_n' - x_{clamp}, n=1, \ldots, N,$$

$$x_{clamp} = \eta x_{max}' + (1-\eta) x_{min}',$$

wherein $x_n'$ is a magnitude of the magnetic field of the measured signal at each of the plurality of sampling points, wherein N is a number of the plurality of sampling points, wherein $x_{clamp}$ is a clamping value, wherein $x_n$ is a magnitude of a magnetic field of the clamped signal at each of the plurality of sampling points, wherein $\eta$ is a clamping index which is between 0 and 1, wherein is a maximal magnitude of the magnetic field of the measured signal, and wherein $x_{max}'$ is a minimal magnitude of the magnetic field of the measured signal.

22. The detection system adapted to perform the adjustment method of the atmos clock as claimed in claim 21, wherein the processing unit retrieves the time of the zero crossing point by performing an interpolation process on two sampling points of the plurality of sampling points that are most adjacent to the zero crossing point among the plurality of sampling points, wherein the clamping process is expressed as:

$$t^* = t_a + \frac{-x_a}{x_{a+1} - x_a}(t_{a+1} - t_a),$$

wherein $t_a$ is a time of a first one of the two sampling points, wherein $t_{a+1}$ is a time of a second one of the two sampling points, wherein $x_a$ is the magnitude of the magnetic field of the clamped signal at the first one of the two sampling points, and wherein $x_{a+1}$ is the magnitude of the magnetic field of the clamped signal at the second one of the two sampling points.

23. The detection system adapted to perform the adjustment method of the atmos clock as claimed in claim 22, wherein the length of one of the plurality of periods is expressed as:

$$T_m = t^*_{m+1} - t^*_m,$$

wherein $t^*_m$ is the time of the zero crossing point in one of the two adjacent ones of the plurality of periods, and wherein $t^*_{m+1}$ is the time of the zero crossing point in another of the two adjacent ones of the plurality of periods.

24. The detection system adapted to perform the adjustment method of the atmos clock as claimed in claim 20, wherein the measured signal is sampled in a sampling rate of 12.5-14.3 (1/s).

25. The detection system adapted to perform the adjustment method of the atmos clock as claimed in claim 13, wherein the processing unit further calculates an average length of multiple periods of the plurality of periods, and outputs the calculated average length to the output device.

26. The detection system adapted to perform the adjustment method of the atmos clock as claimed in claim 25, wherein a number of the multiple periods is larger than or equal to 10.

* * * * *